United States Patent
Sun et al.

(10) Patent No.: US 7,394,147 B2
(45) Date of Patent: Jul. 1, 2008

(54) SEMICONDUCTOR PACKAGE

(75) Inventors: Kuo Yang Sun, Kaohsiung (TW); Chia Ming Yang, Tainan (TW); Hung Yuan Lu, Kaohsiung (TW); Wei Chin Tsai, Kaohsiung (TW); Yi Cheng Lin, Kaohsiung County (TW)

(73) Assignee: Orient Semiconductor Electronics, Limited, Kaohsiung (TW)

( * ) Notice: Subject to any disclaimer, the term of this patent is extended or adjusted under 35 U.S.C. 154(b) by 323 days.

(21) Appl. No.: 11/053,660

(22) Filed: Feb. 9, 2005

(65) Prior Publication Data

US 2006/0012040 A1  Jan. 19, 2006

(30) Foreign Application Priority Data

May 5, 2004  (TW) .............................. 93112640 A

(51) Int. Cl.
  *H01L 23/495* (2006.01)
(52) U.S. Cl. ................ 257/686; 257/678; 257/679; 257/777; 257/E23.033; 257/E23.18; 438/109; 438/119
(58) Field of Classification Search ................ 257/676, 257/686, 777
  See application file for complete search history.

(56) References Cited

U.S. PATENT DOCUMENTS

| | | | |
|---|---|---|---|
| 3,800,192 A | 3/1974 | Eisele et al. | |
| 5,232,962 A | 8/1993 | Dershem et al. | |
| 5,291,061 A | 3/1994 | Ball | |
| 5,323,060 A | 6/1994 | Fogal et al. | |
| 5,721,452 A | 2/1998 | Fogal et al. | |
| 6,333,562 B1 | 12/2001 | Lin | |
| 6,441,496 B1 | 8/2002 | Chen et al. | |
| 6,593,662 B1 | 7/2003 | Pu et al. | |
| 6,706,557 B2 * | 3/2004 | Koopmans | 438/109 |
| 6,731,011 B2 * | 5/2004 | Verma et al. | 257/777 |
| 6,977,439 B2 * | 12/2005 | Kang et al. | 257/777 |
| 2003/0160311 A1 * | 8/2003 | Ismail et al. | 257/678 |
| 2004/0222509 A1 * | 11/2004 | Ogata | 257/686 |
| 2004/0224481 A1 * | 11/2004 | Tomimatsu | 438/455 |

FOREIGN PATENT DOCUMENTS

| | | |
|---|---|---|
| KR | 95-005447 | 5/1995 |
| KR | 2000-67769 | 11/2000 |
| KR | 2002-22268 | 3/2002 |
| TW | 442876 | 6/2001 |
| TW | 465064 | 11/2001 |
| TW | 510573 | 11/2002 |

* cited by examiner

*Primary Examiner*—Dao H Nguyen

(57) ABSTRACT

A semiconductor package includes a substrate, a first chip, a nonconductive adhesive, a second chip and a plurality of supporting balls. The first chip has an upper surface and a lower surface opposite to the upper surface, and the lower surface is mounted on the substrate. The nonconductive adhesive is disposed on the upper surface of the first chip. The second chip has an upper surface and a lower surface opposite to the upper surface, wherein the lower surface is mounted on the upper surface of the first chip by means of the nonconductive adhesive, and the adherent area between the nonconductive adhesive and the second chip is larger than 90% of the area of the lower surface of the second chip. The supporting balls are disposed in the nonconductive adhesive for supporting the second chip.

13 Claims, 6 Drawing Sheets

SEMICONDUCTOR PACKAGE

This application claims the priority benefit of Taiwan Patent Application Serial Number 093112640, filed May 5, 2004, the full disclosure of which is incorporated herein by reference.

BACKGROUND OF THE INVENTION

1. Field of the Invention

The present invention generally relates to a semiconductor package, and more particularly to a semiconductor package including two stacked chips, a non-conductive adhesive disposed between the stacked chips, and supporting balls for defining the necessary space of bonding wires, wherein the adherent area between the non-conductive adhesive and the upper chip is larger than 90% of the area of lower surface of the upper chip, thereby reducing the concentration of stress after an encapsulating process, and further avoiding the chip crack and increasing the yield of the semiconductor package.

2. Description of the Related Art

With ever increasing demands for miniaturization and high operating speeds, a multi-chip module is increasingly attractive in a variety of electronics. The multi-chip module is a module or package capable of supporting more than one chip on a single semiconductor package. For example, a multi-chip memory package includes several memory chips on a commonly shared substrate, which provides size advantages, and increases the storage capacity of the package. Furthermore, a multi-chip package has high operational speed and can decrease the interconnection distance between IC chips, thereby reducing signal delays and access times. In addition, a multi-chip package has an integrally operational function, because it can combine chips having different functions, such as memory chip, logic chip, microprocessor, etc. in a single semiconductor package.

Recently, as described below, two chips were stacked using a mainly conventional semiconductor package. According to the first conventional semiconductor package 2, the first conventional semiconductor package 2 includes a substrate 10, a lower chip 20, a dummy chip 30 and an upper chip 40. Referring to FIG. 1, the lower chip 20 is mounted on the substrate 10 by means of an adhesive 22, and two edges of the upper surface 28 of the lower chip 20 are provided with a plurality of aluminum pads 24, which are electrically connected to a plurality of pads 12 of the substrate 10 through a plurality of first bonding wires 26. Referring to FIG. 2, the dummy chip 30 is mounted on the lower chip 20 by means of an adhesive 32, and defines the necessary space of the first bonding wires 26 such as above a height (H) of 5 mils. Referring to FIG. 3, the upper chip 40 is mounted on the dummy chip 30 by means of an adhesive 42, and the upper surface 48 of the upper chip 40 are provided with a plurality of aluminum pads 44, which are electrically connected to the pads 12 of the substrate 10 through a plurality of second bonding wires 46, such that the two chips 20, 40 are stacked on the substrate 10. However, the first conventional semiconductor package 2 requires a higher manufacturing cost and longer packaging time. Furthermore, there is a mismatch between the expansion coefficients of the dummy chip and the adhesive, and thus the stress of an interface between the dummy chip and the adhesive is increased after an encapsulating process, which can result in chip crack, thus reducing the yield of semiconductor package. The yield of the semiconductor package 2 generally ranges between 30% and 40%.

Furthermore, the second conventional semiconductor package 50 is substantially similar to the first conventional semiconductor package 2. The second conventional semiconductor package 50 includes a substrate 60, a lower chip 70 and an upper chip 90. Referring to FIG. 4, a plurality of aluminum pads 74 are only disposed on the same edge of the upper surface 78 of the lower chip 70. Referring to FIG. 5, the lower chip 70 is mounted on the substrate 60 by means of an adhesive 72, and the aluminum pads 74 of the lower chip 70 are electrically connected to a plurality of pads 62 of the substrate 60 through a plurality of first bonding wires 76. Then, the upper chip 90 is mounted on the lower chip 70 by means of an adhesive 92, and is stacked on the lower chip 70 by using a step-stacked manner. Finally, the upper surface 98 of the upper chip 90 are provided with a plurality of aluminum pads 94, which are electrically connected to the pads 62 of the substrate 60 through a plurality of second bonding wires 96, such that the two chips 70, 90 are stacked on the substrate 60. However, chips formed by this step-stack manner have to be specially designed and are distinctly different from the common chips; therefore, they may not be easy to acquire, and their cost may be increased. Furthermore, a package includes at least two stacked chips so by using this step-stacked manner, each additional chip must be reduced in size, thus the cost of the chip is increased.

In addition, Taiwan Patent Publication Number 442,876, entitled "Multi-chip Package", discloses a stacked structure of a semiconductor package. The semiconductor package includes a chip carrier, a plurality of conductive bumps, a plurality of bonding wires, a plurality of chips (e.g. a lower chip and an upper chip) and an adhesive layer. The lower chip is disposed on the chip carrier. The conductive bumps are disposed on the lower chip. The upper chip is disposed on the lower chip by means of the adhesive layer, and each conductive bump has a cylindrical protrusion for supporting the upper chip. However, the adhesive layer is not a conductive adhesive layer, and the cylindrical protrusion is made of a conductive material, such that the adhesive layer cannot fully isolate the upper chip from the lower chip. Furthermore, the cylindrical protrusion possibly damages the surface of the upper chip.

In addition, Taiwan Patent Publication Number 510,573, entitled "Multi-chip Stacked In A Semiconductor Package", discloses a stacked structure of a semiconductor package. The semiconductor package includes an encapsulant, a plurality of chips, a chip carrier, a plurality of metal traces and a glass fiber epoxy resin layer. The chips are encapsulated in the encapsulant, and each chip has an upper surface, a low surface and a plurality of bonding pads formed on the upper surface. The chip carrier, such as a substrate or a leadframe, is used for mounting the stacked chips. The metal traces are encapsulated in the encapsulant for electrically connecting the bonding pads of the chip to the chip carrier. The glass fiber epoxy resin layer is located between the two chips for mounting two stacked chips. However, the glass fiber epoxy resin layer is made of soft material, and thus the glass fiber epoxy resin layer cannot fully define the necessary space of the bonding wires (i.e. metal traces), such as above a height of 5 mils.

Accordingly, there exists a need for a semiconductor package capable of solving the above-mentioned problem.

SUMMARY OF THE INVENTION

It is an object of the present invention to provide a semiconductor package, which includes an appropriate adherent area between a nonconductive adhesive and a chip, thereby reducing the concentration of stress after an encapsulating process and further avoiding the chip crack and increasing the yield of package.

It is another object of the present invention to provide a semiconductor package including a plurality of supporting balls which are disposed in a nonconductive adhesive and support a chip for defining the necessary space of bonding wires.

The present invention provides a semiconductor package including a substrate, a first chip, a nonconductive adhesive, a second chip and a plurality of supporting balls. The first chip has an upper surface and a lower surface opposite to the upper surface, and the lower surface is mounted on the substrate. The nonconductive adhesive is disposed on the upper surface of the first chip. The second chip has an upper surface and a lower surface opposite to the upper surface, wherein the lower surface is mounted on the upper surface of the first chip by means of the nonconductive adhesive, and the adherent area between the nonconductive adhesive and the second chip is larger than 90% of the area of the lower surface of the second chip. The supporting balls are disposed in the nonconductive adhesive for supporting the second chip.

As compared with conventional semiconductor package, the appropriate adherent area between the nonconductive adhesive and the second chip in the semiconductor package of the present invention is increased, and thus the thermal stress on an interface between the nonconductive adhesive and the second chip is distributed on the whole adherent area during subsequent processes, thereby reducing the concentration of stress after a thermosetting process and further avoiding the chip crack and increasing the yield of package.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Referring to FIGS. 6 to 11, they depict a semiconductor package 100 according to an embodiment of the present invention. The semiconductor package 100 includes a substrate 110, a first chip 120 and a second chip 140. The first chip 120 and the second chip 140 can be memory chips of dynamic random access memories (DRAM), static random access memories (SRAM), flash memories (FLASH), Rambus memories, etc., microprocessors, logic chips or radio chips.

Figure 1:
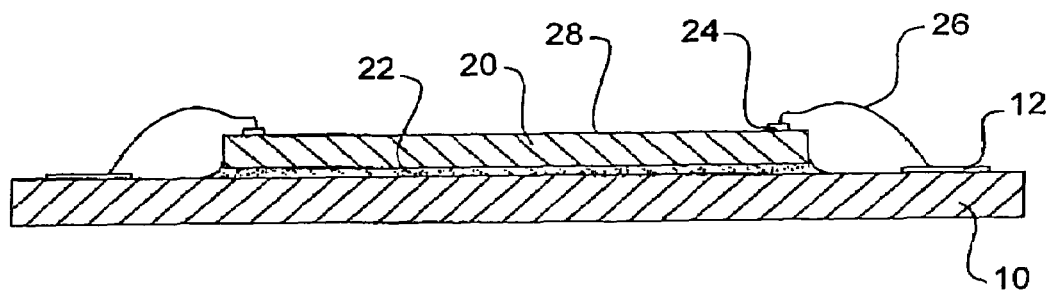
FIGS. 1 to 3 are cross-sectional schematic views showing a method for manufacturing the first semiconductor package in the prior art.
Figure 2:
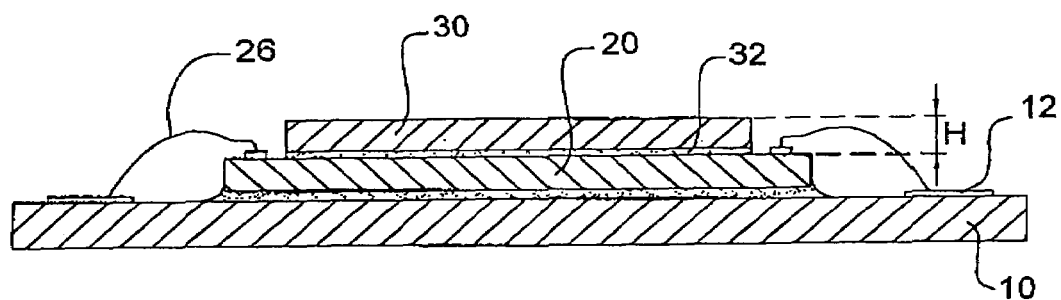
Figure 3:
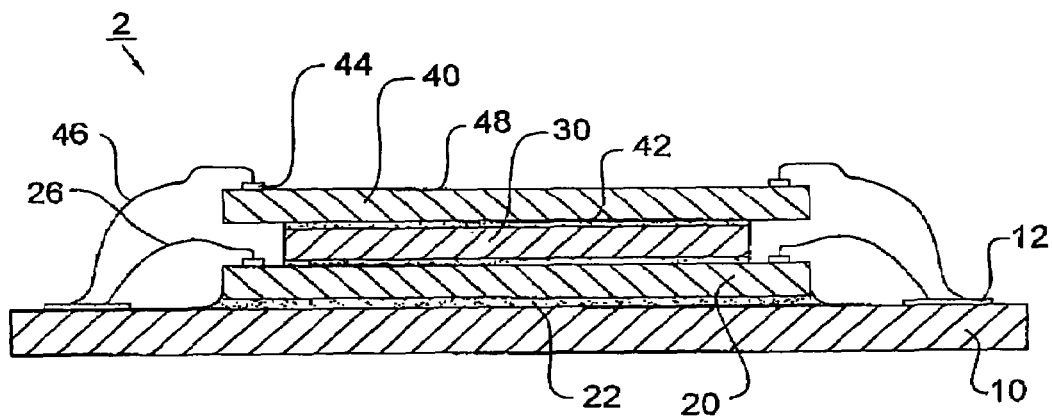
Figure 4:
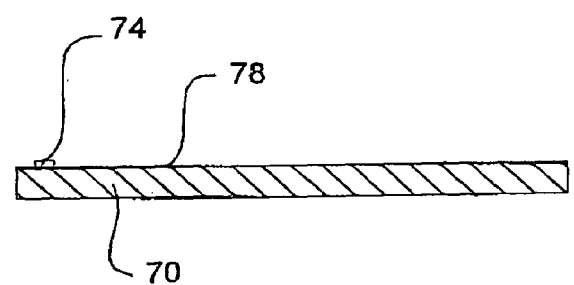
FIGS. 4 and 5 are cross-sectional schematic views showing a method for manufacturing the second semiconductor package in the prior art.
Figure 5:
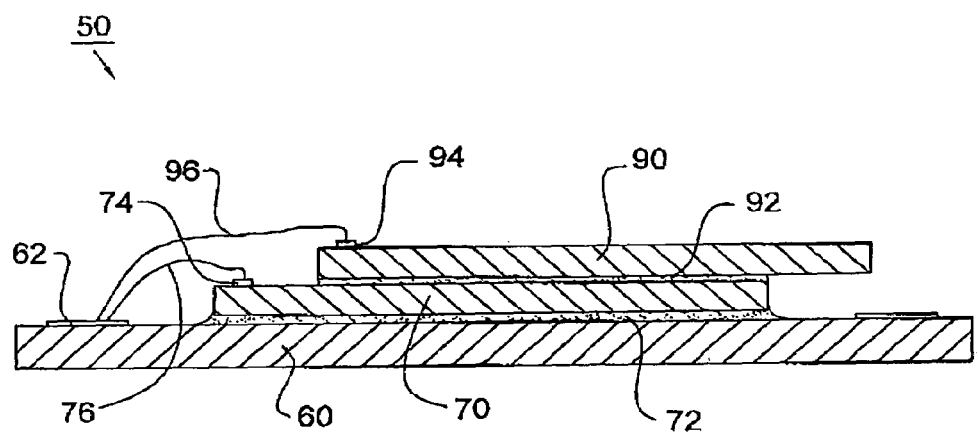
Figure 6:
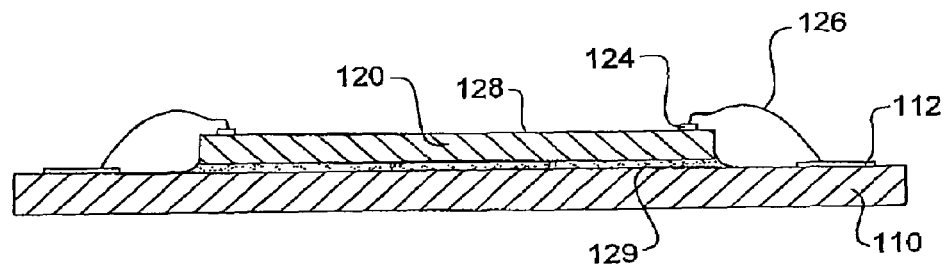
FIGS. 6 to 11 are cross-sectional schematic views showing a method for manufacturing a semiconductor package according to an embodiment of the present invention.

Referring to FIG. 6, the substrate 110 is provided with a plurality of pads 112. The first chip 120 has an upper surface 128 and a lower surface 129 opposite to the upper surface 128, the lower surface 129 is mounted on the substrate 110 by means of an adhesive 122, and the edges of the upper surface 128 (such as two edges of the upper surface 128) are provided with a plurality of pads 124 and a plurality of first bonding wires 126 for electrically connecting the pads 124 of the first chip 120 to the pads 112 of the substrate 110. The pads 124 of the first chip 120 can be aluminum pads.

Figure 7A:
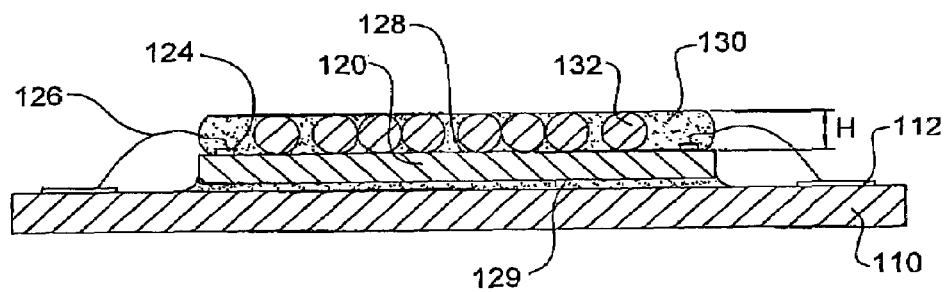
Figure 7B:
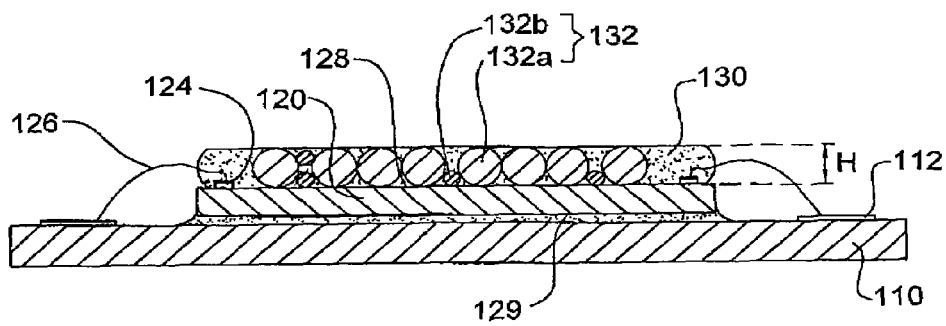
Figure 8:
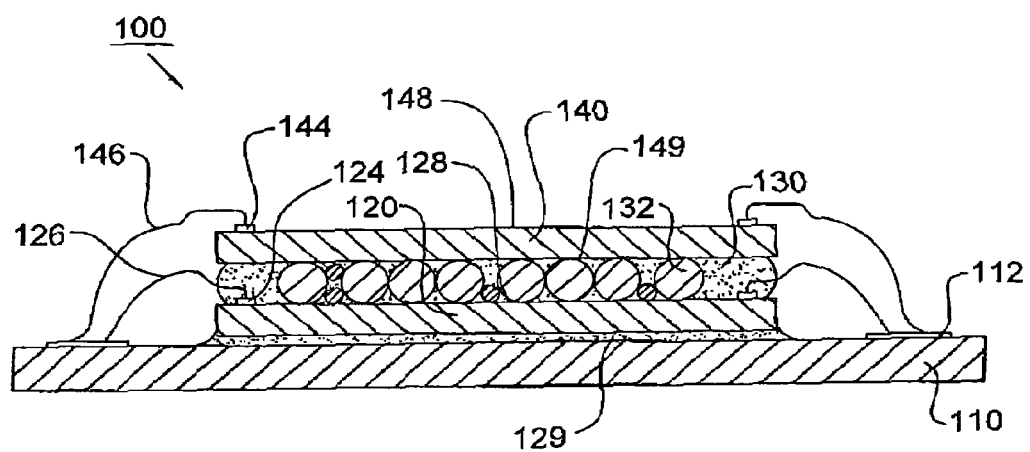

Referring to FIG. 7a, a nonconductive adhesive 130 is disposed on the upper surface 128 of the first chip 120. A plurality of supporting balls 132 are disposed in the nonconductive adhesive 130 by using an intermixing manner, and support the second chip 140, shown in FIG. 8. The supporting balls 132 have a predetermined diameter for defining the necessary space of the first bonding wires 126, such as above a height (H) of 5 mils. The supporting ball 132 can be made of elastic heat-resistant material, such as rubber. According to an alternative embodiment shown in FIG. 7b, the supporting balls 132 are divided into first supporting balls 132a and second supporting balls 132b, and the diameter of the first supporting ball 132a is bigger than that of the second supporting ball 132b. The first supporting ball 132a is used for defining the necessary space of the first bonding wire 126, such as above a height (H) of 5 mils, and the second supporting ball 132b is used for separating the first supporting balls from each other 132a and providing the first supporting balls 132a with more regular and tighter arrangement. Preferably, the number of the second supporting balls 132b is less than 20% of that of all supporting balls 132.

Referring to FIG. 8 again, the second chip 140 has an upper surface 148, a lower surface 149 opposite to the upper surface 148, and the lower surface 149 is mounted on the upper surface 128 of the first chip 120 by means of the nonconductive adhesive 130, and the lower surface 149 is provided with a plurality of pads 144 and a plurality of second bonding wires 146 for electrically connecting the pads 144 of the second chip 140 to the pads 112 of the substrate 110. Preferably, the adherent area between the nonconductive adhesive 130 and the second chip 140 is larger than 90% of the area of the lower surface 149 of the second chip 140.

It is apparent to one of ordinary skill in the art that the semiconductor package 100 of the present invention can further includes a plurality of additional chips (not shown), whose structure is substantially similar to the second chip 140 and are stacked on the second chip 140 in sequence by means of a plurality of nonconductive adhesive and supporting balls, thereby increasing the number of chips of the semiconductor package 100, wherein the subsequently stacked chips don't have to be reduced in size. The substrate 110 of the semiconductor package 100 can be replaced with a leadframe (not shown).

Figure 9:
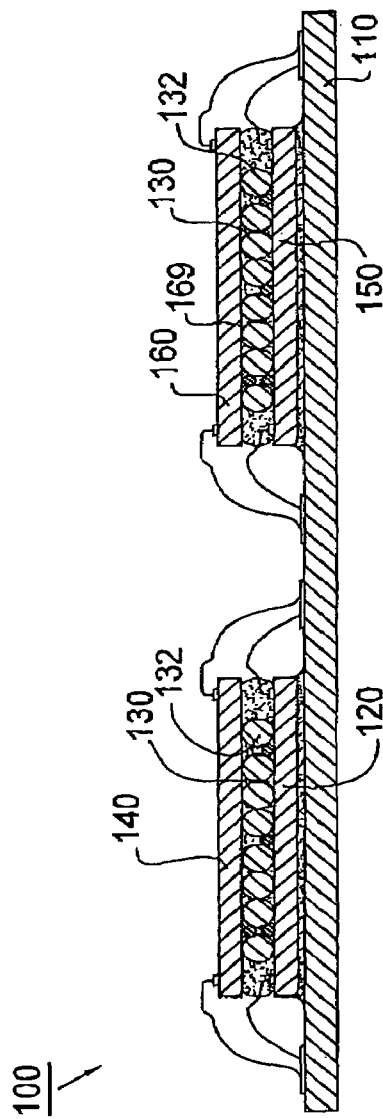

Referring to FIG. 9, the semiconductor package 100 further includes a third chip 150 and a fourth chip 160, whose structure are respectively similar to the first chip 120 and the second chip 140. The third chip 150 and the fourth chip 160 are stacked on the substrate 110 in sequence by means of the nonconductive adhesive 130 and the supporting balls 132, thereby increasing the number of chips included in the semiconductor package 100. The adherent area between the nonconductive adhesive 130 and the fourth chip 160 is larger than 90% of the area of the lower surface of the fourth chip 160.

Figure 10:
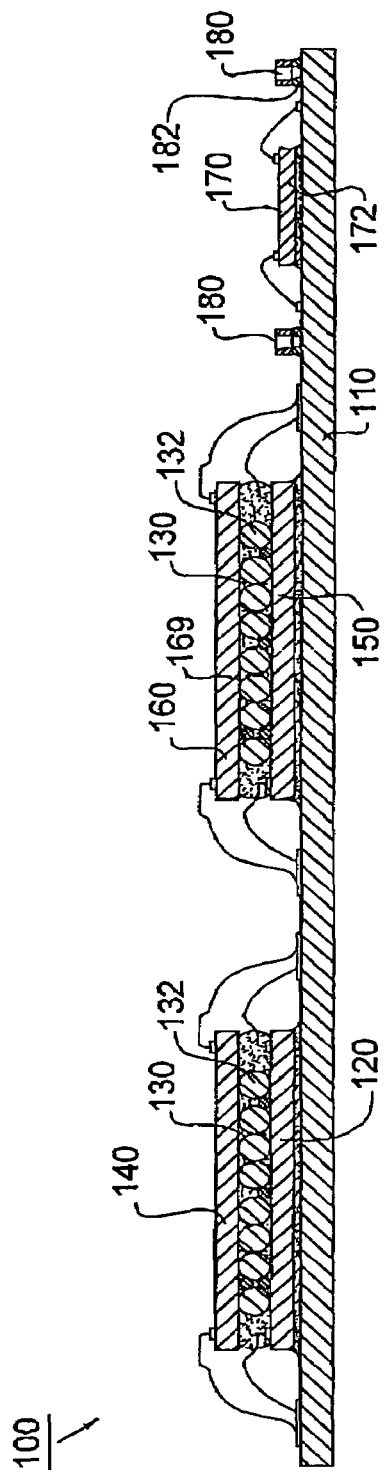

Referring to FIG. 10, the semiconductor package 100 further includes a fifth chip 170, such as a control chip, and a plurality of passive components 180. The fifth chip 170 is mounted on the substrate 110 by means of an adhesive 172, and electrically connected to the substrate 110 by a wire bonding manner. The passive components 180 can be soldered to the substrate 110 by means of solder paste 182, and are electrically connected to the substrate 110.

Figure 11:
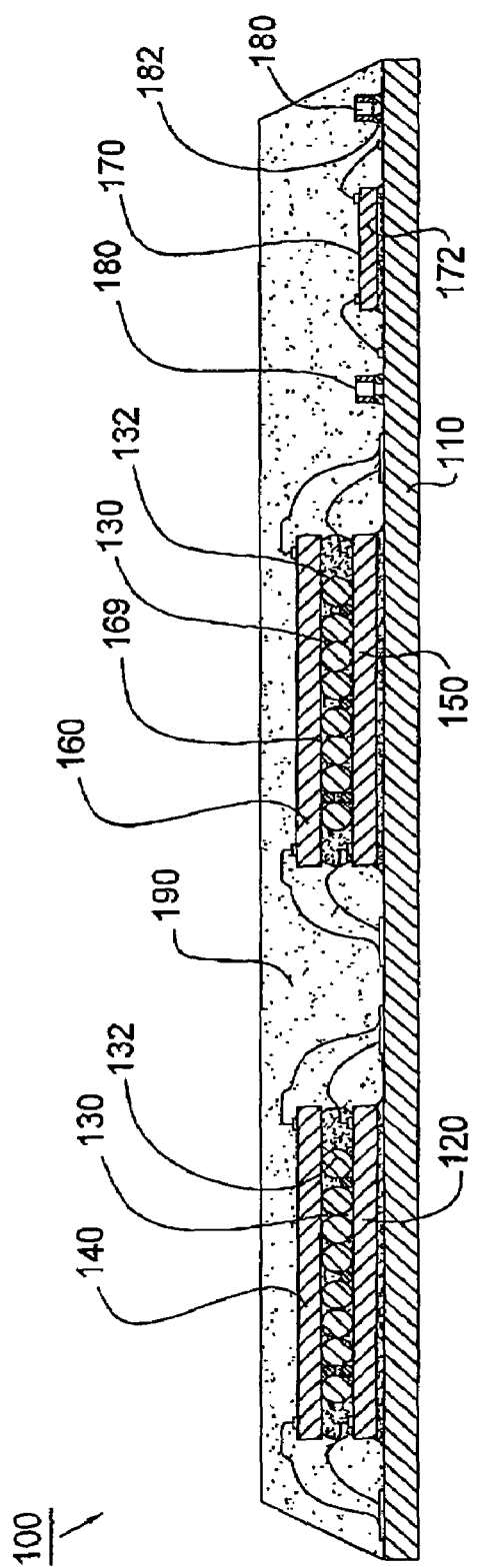

Referring to FIG. 11, an encapsulant 190, such as epoxy resin, is formed on the substrate 110 for encapsulating the first, second, third, fourth and fifth chips 120, 140, 150 160 and 170, the passive components 180 and all bonding wires. Finally, the encapsulant 190 is diced, and a cover (not shown) is joined on the encapsulant 190 by using a thermal adhesive manner or a supersonic manner, thereby forming a complete package. The semiconductor package 100 can be a semiconductor package of a flash memory card.

As compared with conventional semiconductor package, the adherent area between the nonconductive adhesive 130 and the second chip 140 in the semiconductor package of the present invention is increased, and thus the thermal stress on an interface between the nonconductive adhesive 130 and the second chip 140 is distributed on the whole adherent area during sequent processes, thereby reducing the concentration of stress after a thermosetting process and further avoiding the chip crack and increasing the yield of package. Generally, the yield of the semiconductor package of the present invention is approximately more than 92%.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A semiconductor package, comprising:
    a carrier;
    a first chip having an upper surface and a lower surface opposite to the upper surface, wherein the lower surface is mounted on the carrier;
    a nonconductive adhesive disposed on the upper surface of the first chip;
    a second chip having an upper surface and a lower surface opposite to the upper surface, wherein the lower surface is mounted on the upper surface of the first chip by means of the nonconductive adhesive, and the adherent area between the nonconductive adhesive and the second chip is larger than 90% of the area of the lower surface of the second chip;
    a plurality of supporting balls disposed in the nonconductive adhesive and comprising a plurality of first supporting balls supporting the second chip, wherein said supporting balls further comprise a plurality of second supporting balls, the diameter of the first supporting ball is bigger than that of the second supporting ball, and the diameter of the second supporting ball is smaller than the distance between the first and second chips; and
    wherein the number of the second supporting balls is less than 20% of that of all supporting balls.

2. The semiconductor package as claimed in claim 1, wherein the carrier is provided with a plurality of first pads; the upper surface of the first chip is provided with a plurality of second pads and a plurality of first bonding wires for electrically connecting the second pads of the first chip to the first pads of the carrier; and the upper surface of the second chip is provided with a plurality of third pads and a plurality of second bonding wires for electrically connecting the third pads of the second chip to the first pads of the carrier.

3. The semiconductor package as claimed in claim 2, wherein the supporting balls have a predetermined diameter for defining a necessary space of the first bonding wires.

4. The semiconductor package as claimed in claim 2, wherein the first supporting balls are used for defining the necessary space of the first bonding wire, and the second supporting balls are used for separating the first supporting balls from each other.

5. The semiconductor package as claimed in claim 2, wherein the diameter of the second supporting ball is smaller than the distance between the highest point of a plurality of bonding wires and the upper surface of the first chip.

6. The semiconductor package as claimed in claim 1, wherein the supporting balls are made of elastic heat-resistant material.

7. The semiconductor package as claimed in claim 6, wherein the supporting balls are made of rubber.

8. The semiconductor package as claimed in claim 1, further comprising:
    a third chip having an upper surface and a lower surface opposite to the upper surface, wherein the lower surface is mounted on the carrier; and
    a fourth chip having an upper surface and a lower surface opposite to the upper surface, wherein the lower surface is mounted on the upper surface of the third chip by means of the nonconductive adhesive, and the adherent area between the nonconductive adhesive and the fourth chip is larger than 90% of the area of the lower surface of the fourth chip.

9. The semiconductor package as claimed in claim 8, further comprising:
    a fifth chip mounted on the carrier.

10. The semiconductor package as claimed in claim 9, further comprising:
    a plurality of passive components mounted on the carrier.

11. The semiconductor package as claimed in claim 10, further comprising:
    an encapsulant for encapsulating the first, second, third, fourth and fifth chips, and the passive components.

12. The semiconductor package as claimed in claim 11, wherein the semiconductor package is a semiconductor package of a memory card.

13. The semiconductor package as claimed in claim 1, further comprising:
    an encapsulant for encapsulating the first and second chips.

* * * * *